United States Patent [19]

Joly

[11] Patent Number: 5,153,464

[45] Date of Patent: Oct. 6, 1992

[54] BICMOS TRI-STATE OUTPUT BUFFER

[75] Inventor: Robert Joly, Los Altos, Calif.

[73] Assignee: Hewlett-Packard Company, Palo Alto, Calif.

[21] Appl. No.: 627,688

[22] Filed: Dec. 14, 1990

[51] Int. Cl.⁵ .......................................... H03K 19/017
[52] U.S. Cl. .................... 307/473; 307/446; 307/570
[58] Field of Search ............. 307/473, 446, 448, 570, 307/475, 450, 451

[56] References Cited

U.S. PATENT DOCUMENTS

| | | | |
|---|---|---|---|
| 4,649,294 | 3/1987 | McLaughlin | 307/446 |
| 4,678,940 | 7/1987 | Vasseghi et al. | 307/473 |
| 4,678,943 | 7/1987 | Uragami et al. | 307/473 |
| 4,703,203 | 10/1987 | Gallup et al. | 307/473 X |
| 4,719,373 | 1/1988 | Masuda et al. | 307/570 |
| 4,725,982 | 2/1988 | Hara et al. | 307/473 X |
| 4,746,817 | 5/1988 | Banker et al. | 307/446 |
| 4,779,014 | 10/1988 | Masuoka et al. | 307/446 |
| 4,794,280 | 12/1988 | Van Tran | 307/446 |
| 4,804,867 | 2/1989 | Okitaka et al. | 307/473 |
| 4,816,705 | 3/1989 | Ohba et al. | 307/446 |
| 4,837,463 | 6/1989 | Okitaka et al. | 307/473 |
| 4,839,540 | 6/1989 | Ueno | 307/473 |
| 4,985,645 | 1/1991 | Tsutsui | 307/446 |
| 5,001,365 | 3/1991 | Murabayashi et al. | 307/446 |
| 5,047,669 | 9/1991 | Iwamura et al. | 307/446 |

FOREIGN PATENT DOCUMENTS

0316793A3 11/1987 European Pat. Off. .
0383554A3 2/1990 European Pat. Off. .

OTHER PUBLICATIONS

G. J. Gaudenzi & D. C. Reedy, "Emitter Follower Reverse Bias Clamp", IBM Technical Bulletin vol. 26, No. 7B Dec. 1983.

Primary Examiner—David Hudspeth

[57] ABSTRACT

An improved tri-state output buffer of the type that includes an output stage comprising a pair of bipolar transistors in a totem-pole configuration. A CMOS predriver arrangement includes a circuit configuration for selectively adjusting the resistance between the base and the emitter of the source-follower output transistor. The predriver protects the source-follower from harmful bias effects by selectively adjusting the resistance in the emitter-to-base path of the source-follower.

9 Claims, 7 Drawing Sheets

FIG. 1
PRIOR ART
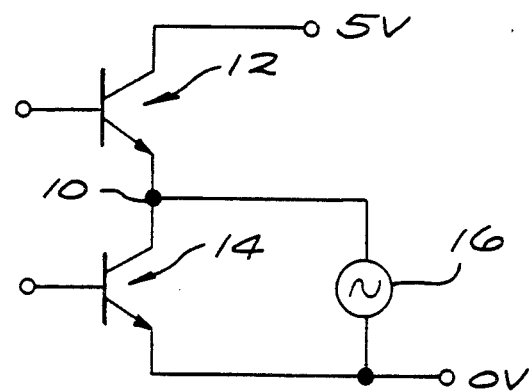
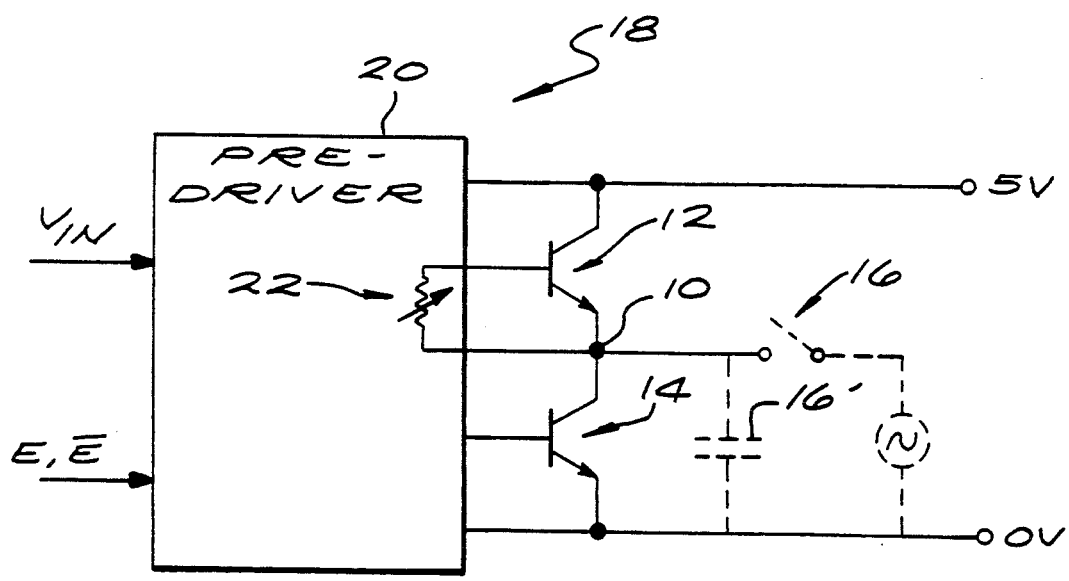
FIG. 2

FIG. 4(a)
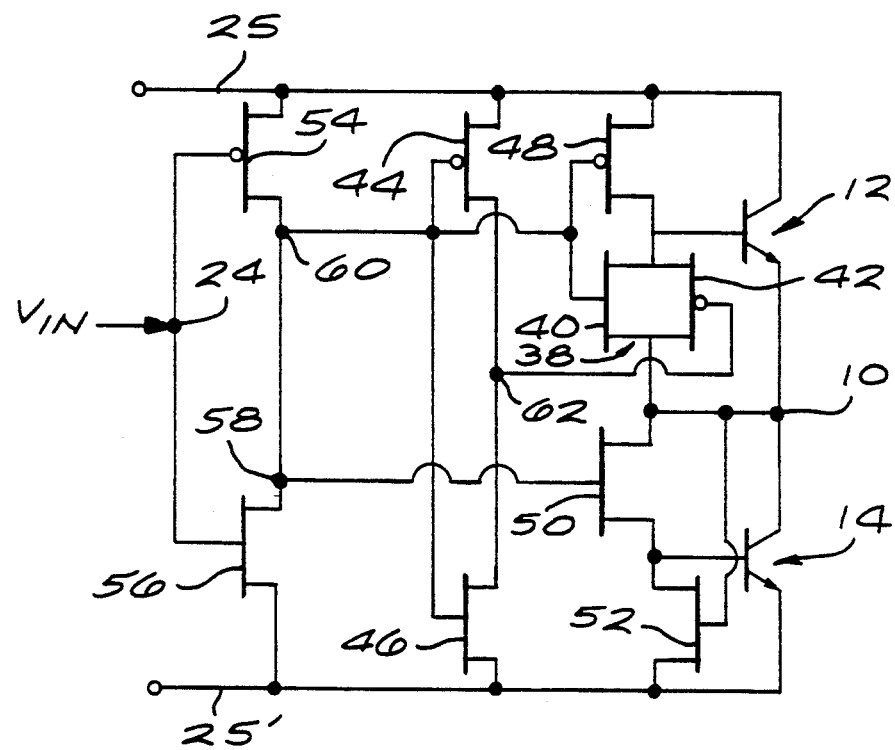
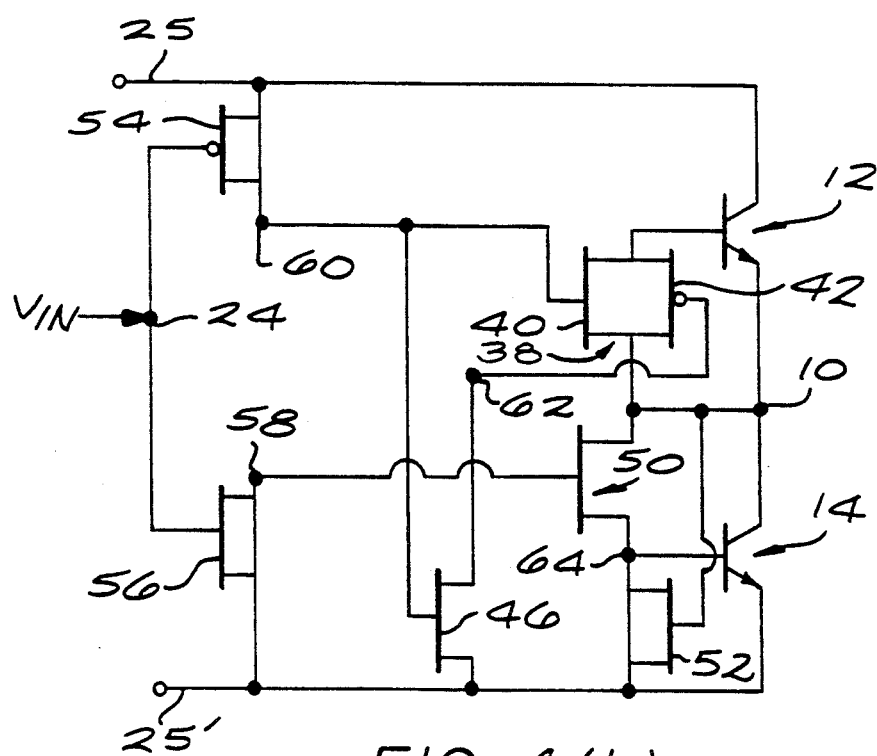
FIG. 4(b)

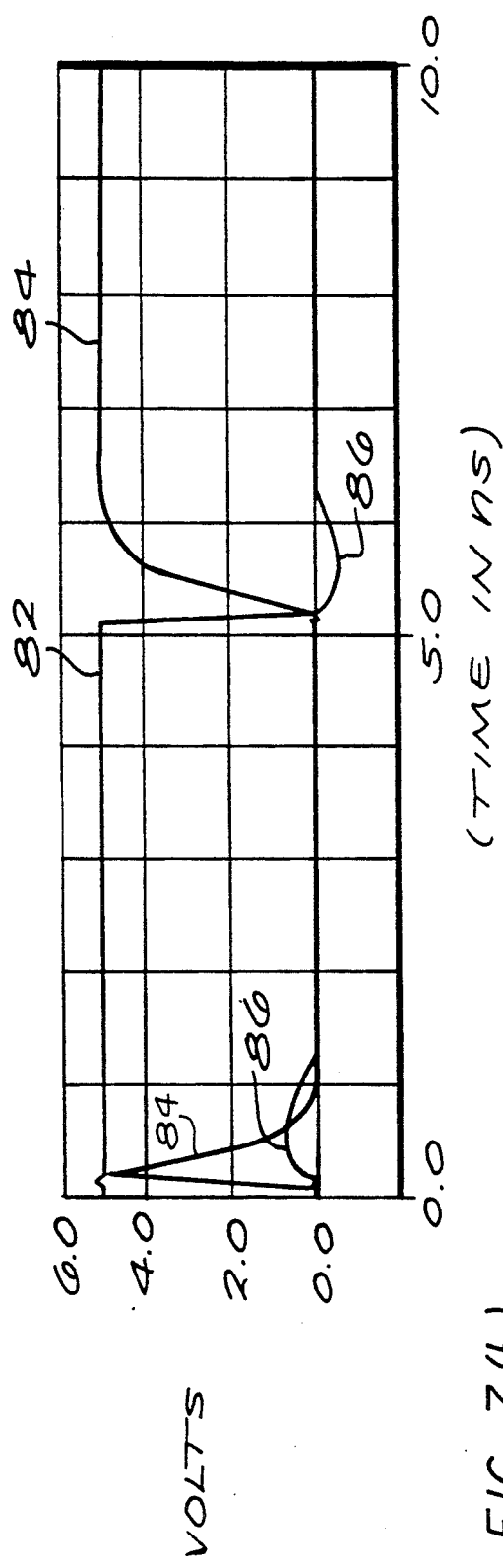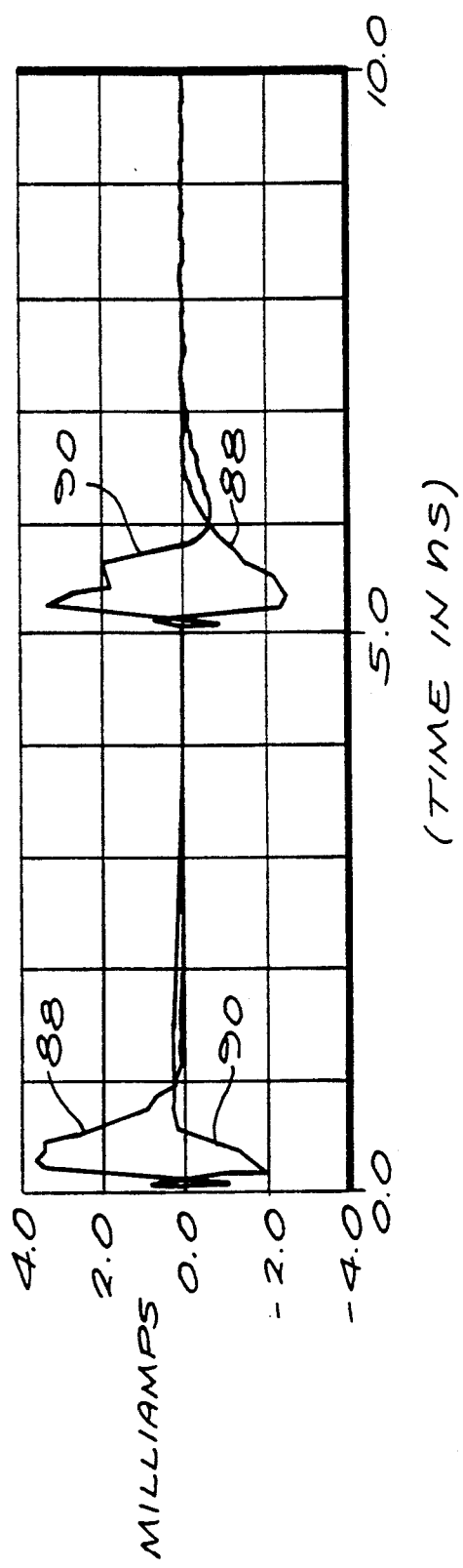
FIG. 7(a)
FIG. 7(b)

BICMOS TRI-STATE OUTPUT BUFFER

BACKGROUND

1. Field of Invention

The present invention relates to a tri-state output buffer of the type that includes a totem-pole or series arrangement of a pair of bipolar output transistors. More particularly, this invention pertains to a circuit for protecting the base-emitter junction of the source-follower from harmful levels of reverse bias and for preventing conduction when the buffer is disabled.

2. Description of the prior art

The operation of tri-state logic requires a high impedance or "disabled" state in addition to the "high" and "low" levels of binary logic. As a consequence, the output can occasionally "float". This can lead to serious problems for certain circuit topologies.

A conventional bipolar tri-state buffer can include a dual transistor push-pull output driver stage with a first bipolar transistor coupled between a d.c. voltage supply and an output load and a second bipolar transistor of the same type coupled between the output load and ground. The output stage of a conventional tri-state buffer of this type is illustrated in the schematic diagram of FIG. 1. In operation, a high voltage state is realized at the output node 10 by turning on a first source-follower bipolar transistor 12 and turning off a second output transistor 14. A low output state is realized by turning off the first bipolar transistor 12 and turning on the second transistor 14. A high impedance is achieved at the output node 10 by turning off both transistors (disabled state). As mentioned earlier, the output node 10 effectively floats when the buffer is not enabled. Normally, in a tri-state buffer of the type shown in FIG. 1, the bases of the transistors 12 and 14 are tied to ground in the disabled state. The node 10 is driven to the high state by tying the base of the transistor 12 high and that of the transistor 14 low and vice versa.

External I/0 driver circuitry 16 is, of course, generally coupled to the output node 10 which is also coupled to the emitter terminal of the source-follower transistor 12. The driver 16 is represented by a switch or gate whose state depends upon whether the driver 16 is operative in a "transmitter" or "receiver" mode and a capacitor 16' that represents the capacitance of the conductor that connects the node 10 to the driver 16. The presence of the capacitor 16' makes the switching transition time at the node 10 longer than that at the base of the bipolar transistor 12. This can lead to problems of degradation of the transistor 12 and, accordingly, the entire buffer, when enabled as the transistor 12 can become reverse-biased during a high-to-low transition of the node 10.

While undesirable reverse-biasing of the transistor 12 can occur when the buffer is enabled, such a situation is transient. More severe non-transient reverse-biasing (and forward-biasing) can occur when the buffer is disabled. The driver 16 drives the node 10 when operating in a transmitter mode. The receiver buffer is disabled at this time and the connection between the emitter of the transistor 12 and the node 10 makes the output stage subject to the output of the external driver.

The imposition of substantial reverse bias voltage ($V_{BE}<0$) between the base and emitter of the transistor 12 can produce a slow degradation and effect the long-term reliability of the chip. Furthermore, forward biasing of the output transistor can induce unintended current flow within the disabled buffer, hampering its effective operation.

SUMMARY OF THE INVENTION

The present invention addresses and overcomes the above-described shortcomings of the prior art by providing, in a first aspect, an improvement in a tri-state output buffer for selectively providing a high signal level, a low signal level and a high impedance output to an output node. More particularly, the invention pertains to an improvement in a tri-state output buffer of the type that includes an input port for receiving an input signal and an enable port for receiving an enable/disable signal, a first and a second bipolar output transistor connected in series between a first and a second power terminal. The collector of the first transistor is in communication with the first power terminal and the emitter of the first transistor is in communication with the output node. The collector of the second transistor is in communication with the output node and the emitter of the second transistor is in communication with the second power supply terminal.

The improvement upon a tri-state output buffer of the type described above which is provided by this invention includes a circuit for connecting the emitter to the base of the first bipolar transistor. Such circuit includes means for selectively protecting the first transistor against harmful bias.

In a second aspect, the invention provides a method for operating a tri-state buffer of the type that includes an input port for receiving an input signal and an enable port for receiving an enable/disable signal. The buffer further includes a first and a second bipolar output transistor connected in series between a first and a second power supply terminal. The collector of the first transistor is in communication with the first power terminal and the emitter of the first transistor is in communication with an output node. The collector of the second transistor is in communication with the output node and the emitter of the second transistor is in communication with the second power terminal.

The method of the invention pertaining to the above-referenced type of buffer includes the steps of providing a circuit connection between the emitter and the base of the first transistor and selectively adjusting the flow of current therein. Such selective adjustment protects the first transistor against harmful bias.

The foregoing and other features and advantages of this invention will become further apparent from the detailed description that follows. Such description is accompanied by a set of drawing figures. Numerals of the drawing figures, corresponding to those of the written description, point to the various features of the invention, like numerals referring to like features throughout both the written description and the drawings.

BRIEF DESCRIPTION OF THE DRAWINGS

FIG. 1 is a schematic diagram of the output stage of a prior art tri-state buffer for illustrating the potential for reverse biasing of the source-follower bipolar output transistor;

FIG. 2 is a symbolic block schematic diagram for illustrating the principle of operation of an improved tri-state output buffer in accordance with the invention;

FIGS. 4(a) and 4(b) are schematic diagrams of the tri-state buffer of the invention with circuit topology simplified to reflect operation when the buffer is enabled and disabled, respectively;

FIGS. 7(a) and 7(b) are graphs of the response of the invention in its disabled state to the imposition of a high voltage (from an external driver) to the buffer output node;

DETAILED DESCRIPTION

Figure 3:
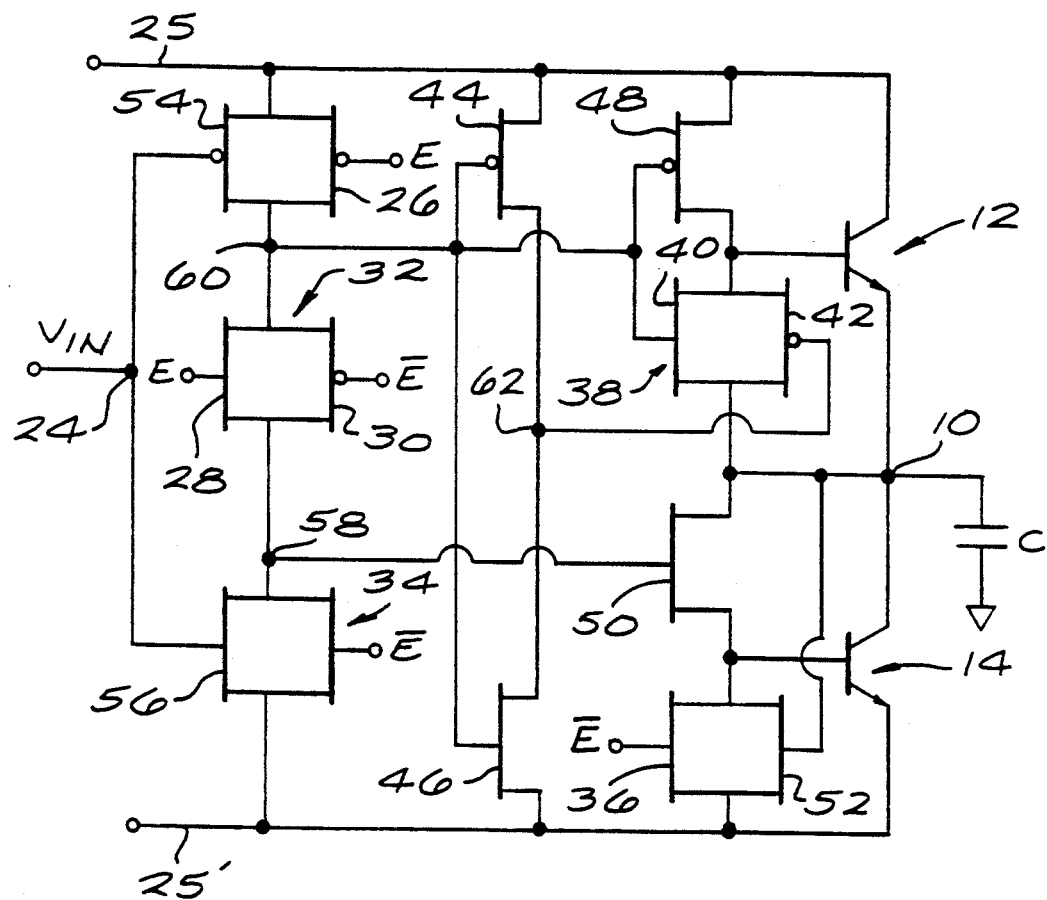
FIG. 3 is a detailed circuit schematic diagram of a tri-state output buffer including a CMOS predriver in accordance with the invention.

FIG. 2 is a symbolic block schematic diagram for illustrating the principle of operation of the present invention whereby a tri-state output buffer of the type that includes a totem-pole arrangement of output transistors 12 and 14 is protected from the imposition of substantial reverse bias upon the source-follower transistor 12 and prevented from conduction when the buffer is disabled and its output mode is activated by an external driver 16. As mentioned above, in the prior art the source-follower transistor 12 is subjected almost continuously to significant reverse biasing of the base-emitter junction that can yield severe reliability problems.

The present invention is illustrated in a buffer comprising npn output transistors 12 and 14 in which the reverse bias problem occurs when the node 10 undergoes a "high" to "low" transition when the buffer is enabled and when the buffer is disabled and the node is driven high by the external driver 16. As will be seen below and as will be appreciated by those skilled in the art, a corresponding problem occurs in a totem-pole output stage comprising pnp transistors when the node 10 undergoes a low-to-high transition or when the external driver 16 drives the node 10 low and it will be understood that the detailed circuitry illustrated in FIG. 3 may be correspondingly modified to achieve the advantages of this invention through straightforward modification and adaptation of the circuit of FIG. 3 to accommodate the pnp output devices.

Returning to FIG. 2, the external driver 16, including a representative capacitive element 16' is connected to the output node 10 only when the buffer 18 is disabled (E is "low"). When the buffer 18 is enabled (E is "high"), a predriver circuit 20 either turns on the source-follower transistor 12 and turns off the transistor 14 (driving the node 10 high) or turns off the source-follower transistor 12 and turns on the transistor 14 (driving the node 10 low) in a controlled way to prevent saturation of the transistor 12.

In addition, the predriver circuit 20 effectively provides a clamp, represented by a variable resistor 22, between the base and emitter of the transistor 12. The clamp functions so that, when the buffer 18 is enabled, the resistor 22 is set to a large value that allows a low to high output transition to occur at the node 10 and is set to a small value when a high to low transition occurs at the node 10. Recalling from the above discussion that, for an output stage comprising npn transistors, a substantial reverse bias can be imposed upon the transistor 12 as a consequence of a high to low transition at the node 10, the reduction in the resistance of the variable resistor 22 acts in two beneficial ways. First, by reducing the value of the resistor 22, carriers are extracted from the base of the transistor 12, turning it off. Secondly, the reduced value of the resistance forces the base-emitter voltage of the transistor 12 to a low value, preventing any substantial reverse biasing of the transistor 12.

When the buffer 12 is disabled, the transistor 14 is turned off, the variable resistor is set to a small value and, with the exception of the physical interconnections to the variable resistor 22, the transistor 12 is essentially disconnected from the predriver 20. By maintaining the value of the variable resistor 22 low, the transistor 12 is prevented from conducting, particularly in the case of a high to low output transition forced upon the buffer 18 by the external driver 16 (npn output transistors). Furthermore, as is also crucial, the value of the resistance is maintained low during a low to high output transition to prevent reverse-biasing of the base-emitter junction of the transistor 12.

Having described the invention in an abbreviated form, a tri-state buffer, including CMOS predriver in accordance with the invention, is shown in the schematic diagram of FIG. 3. The circuit disclosed in FIG. 3 is suitable for fabrication in integrated circuit form and includes a node or terminal 24 for receiving a digital data input signal $V_{IN}$. The buffer operates between a first power supply terminal 25 and a second power supply terminal 25'. A 5 volt supply voltage is applied to the first power supply terminal 25 while the second power supply terminal 25' is maintained at ground.

An enable signal E is applied to and controls the conductivity of a p-channel FET 26 and an n-channel FET 28 which, along with a p-channel FET 30, forms a transmission gate 32. The complement $\overline{E}$ of the enable signal E is applied to and controls the conductivity of the p-channel FET 30, an n-channel FET 34 and an n-channel FET 36 as shown in FIG. 3.

The complementary signals E and $\overline{E}$ control the state of the buffer. When E is high ($\overline{E}$ low) the digital input signal $V_{IN}$ determines the level of the output node 10. When E is low and $\overline{E}$ is high, the buffer is in the disabled state and a high impedance appears at the node 10. The foregoing defines the functional requirements of any tri-state buffer and, as will be shown, the circuit of FIG. 3 performs such basic functions while providing advantages over prior art devices.

Returning to FIG. 3, a second transmission gate 38 consists of an n-channel FET 40 and a p-channel FET 42. As shown, the signals at the gates of the FETs 40 and 42 are always out of phase as a consequence of their interconnection as shown to an inverter comprising a p-channel FET 44 and an n-channel FET 46.

A p-channel FET 48 which, when conducting, pulls up the base voltage of the source follower transistor 12 and is never on at the same time as the transmission gate 38, and an n-channel FET 50 act, in conjunction with the transmission gate 38 to turn on the output transistor 14 during a high-to-low transition at the output node 10.

At a sufficiently low output voltage, the FET 50 behaves like a resistor that tends to equalize the base and collector voltages of the transistor 14, turning it off when the output voltage drops below about 0.6 volts and preventing the transistor 14 from saturating. When the output is high, the n-channel FET 52 conducts and turns the output transistor 14 off. A p-channel FET 54 and an n-channel FET 56 that accept the digital data $V_{IN}$ complete the circuit of FIG. 3. As shown below, the FETs 54 and 56 behave like an inverter when the buffer is enabled (E high), pulling predetermined circuit nodes to appropriate levels to drive the remainder of the predriver circuit.

FIG. 4(a) is a schematic diagram of the tri-state buffer of the invention with the circuit topology reduced to reflect operation when enabled (E high, $\overline{E}$ low) and FIG. 4(b) is a corresponding circuit diagram that has been reduced to illustrate the operation of the buffer when disabled (E low, $\overline{E}$ high). (During the discussion to follow referring to FIGS. 4(a) and 4(b), mention will occasionally be made of circuit elements missing from those figures. The absences result from the effect of the enable and disable signals E and $\overline{E}$ upon the particular elements of "basic" circuit of FIG. 3 and reference back to that figure may clarify a complete comprehension of the discussion.) In FIG. 4(a), the state of the output node 10 is responsive to $V_{IN}$ while a high impedance is always provided to the node 10 when the buffer is disabled.

Referring first to the configuration of the predriver in the enabled state as shown in FIG. 4(a), the signals provided to the gates of the p-channel FET 26 and the n-channel FET 34 render those devices non-conductive while the signals applied to the gates of the FETs of the transition gate 32 render it a low-impedance conductive device. Accordingly, as shown in FIG. 4(a), the FETs 54 and 56 form an inverter stage of the buffer for receiving a digital data input signal $V_{IN}$. In addition, the low input applied to the gate of the FET 36 renders that device non-conductive, leaving the n-channel FET 52 to control the interconnection of the base and emitter of the output transistor 14.

When the buffer is enabled (E high, $\overline{E}$ low) and the binary signal $V_{IN}$ applied at the input node 24 is high, the n-channel FET 56 conducts, driving the nodes 58 and 60 low. The low state of the node 60 is simultaneously applied to the gates of the FETs 44 and 46 which, in combination, form an inverter, causing the FET 44 to conduct and pull up the node 62. Since a low voltage is applied to the gate of the n-channel FET 40 while a high voltage is applied to the gate of the p-channel FET 42, the transmission gate 38 is rendered non-conductive. Referring to FIG. 2, this corresponds to the situation in which the variable resistance 22 is large, allowing a low-to-high output transition to take place.

The low voltage level at the node 60 is applied to the gate of the p-channel FET 48, rendering it conductive and pulling up the base voltage of the source-follower transistor 12. The state of the output node 10 was previously low, and the load capacitance 16' maintains that state at the node 10 subsequent to the transition in the level of the base voltage of the bipolar transistor 12. As a result, the transistor 12 is forward-biased and conductive, driving the output node 10 high. At the same time, the low state of the node 58 is applied to the gate of the n-channel FET 50, rendering it an open circuit. As long as the voltage remains low at the node 10, the transistor 14 remains uninvolved. However, when the transition to a high-voltage level takes place at the node 10, the n-channel FET 52 conducts, connecting its base terminal to ground and clamping the transistor 14 off.

Conversely, when the digital data signal $V_{IN}$ applied to the node 24 is low, the FET 54 conducts, pulling the node 60 up. This, in turn, turns on the FET 46 to pull the node 62 down. A high voltage is applied to the gate of the FET 40 at the same time that a low voltage is applied to the gate of the FET 42, rendering the transmission gate 38 conductive to provide a low resistance path between the base and the emitter of the source-follower transistor 12. Again, referring to FIG. 2, this corresponds to setting the variable resistor 22 to a small value that extracts the carriers from the base of the transistor 12 and turns it off. Furthermore, the relatively small resistance in the path between the base and the emitter of the transistor 12 forces the base-emitter voltage of the transistor 12 to a low value that prevents any substantial reverse biasing.

The node 58 is driven high, making the FET 50 conductive and providing a low resistance path between the collector and the base of the output transistor 14. For a short time the base of the transistor 14 can go as high as one volt, providing extremely strong conduction; when all of the current that the FET 50 can supply is injected into the base of the transistor 14. Subsequently, the level at the node 10 is drawn down until the node 10 and the base of the transistor 14 settle at about 0.6 volts. This completes the high-to-low transition of the buffer.

The effective configuration of the disabled buffer (E low, $\overline{E}$ high) is illustrated in FIG. 4(b). As shown, the p-channel FET 26, the n-channel FET 34 and the n-channel FET 36 conduct while the n-channel FET 28 and the p-channel FET 30 that comprise the transmission gate 32 do not. Consequently, the nodes 60 and 58 are decoupled while the FETs 26, 34 and 52 are effectively "eliminated" from the disabled buffer. The nodes 58 and 64 are low and the node 60 is high regardless of the voltage applied to the input node 24.

The high state of the node 60 causes the FET 46 to conduct, pulling the node 62 low. Accordingly, a high voltage is applied to the gate of the n-channel FET 40 at the same time that a low voltage is applied to the gate of the p-channel FET 42. As a result, the transmission gate 38 comprising the two FETs conducts, completing a low resistance connection between the emitter and base of the source-follower output transistor 12. At the same time, the FET 48 and the FET 50 act as open circuits, essentially disconnecting the source-follower transistor 12 from the rest of the predriver with the exception of the aforementioned low-resistance emitter-base circuit path.

By keeping the emitter-base resistance of the transistor 12 low, the transistor is prevented from conducting, particularly during a high-to-low output transition forced upon the buffer by the external driver. As mentioned earlier with regard to the enabled buffer, it is also crucial to keep the emitter-base resistance low to prevent reverse biasing of this junction during a high-to-low output transition. The output transistor 14 is turned off during the disabled state since, as mentioned earlier, a low resistance path provided between the emitter and the base of that transistor prevents its forward biasing regardless of the voltage imposed upon the output node 10. Accordingly, the buffer provides a high impedance output at the node 10 when disabled.

Figure 5A:
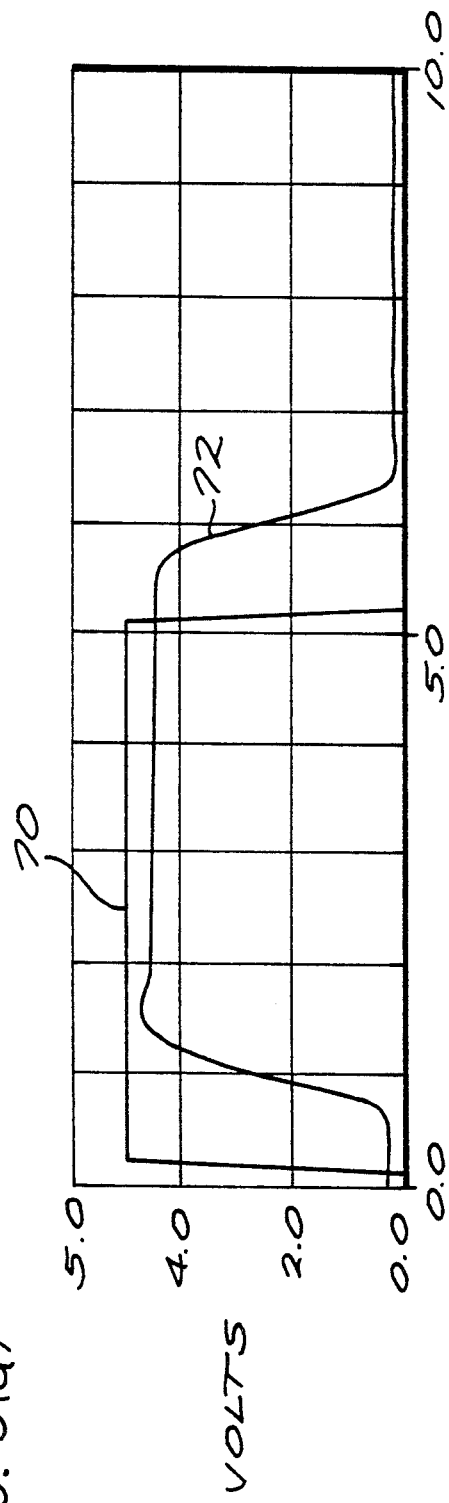
FIGS. 5(a) and 5(b) are graphs of the response of a buffer in accordance with the invention to an input pulse (load capacitance 5 pF)
Figure 5B:
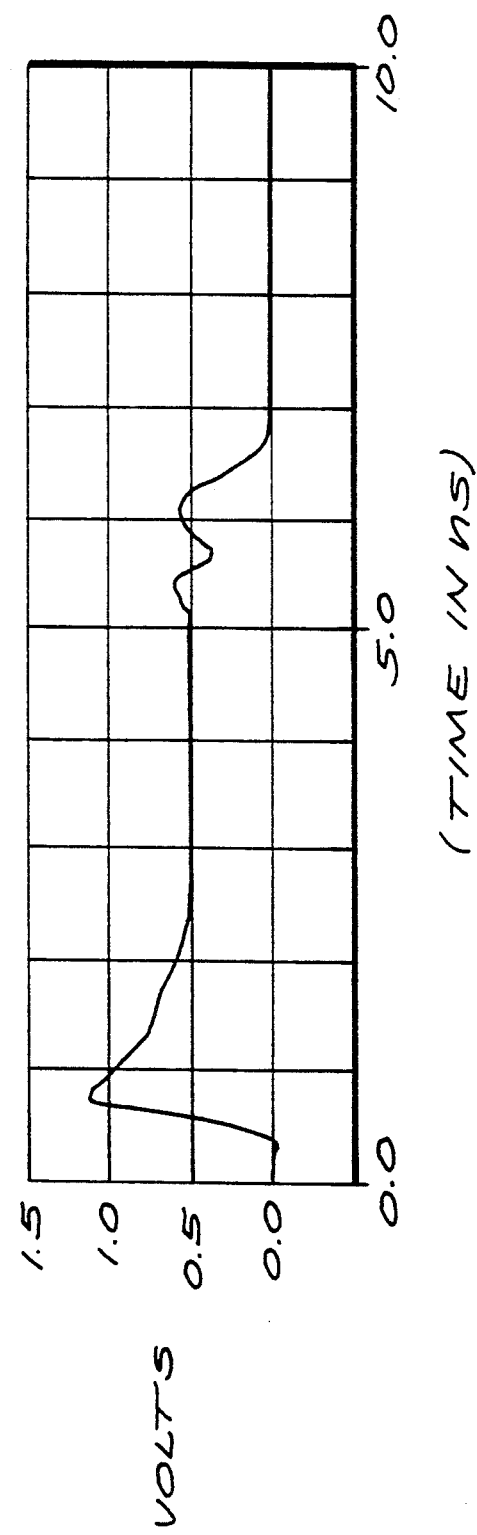

FIGS. 5(a) and 5(b) are graphs of the response of a buffer in accordance with the invention to an input pulse. The data of FIGS. 5(a) and 5 (b) are derived from a simulation based upon a load capacitance of 5 pF.

Figure 6A:
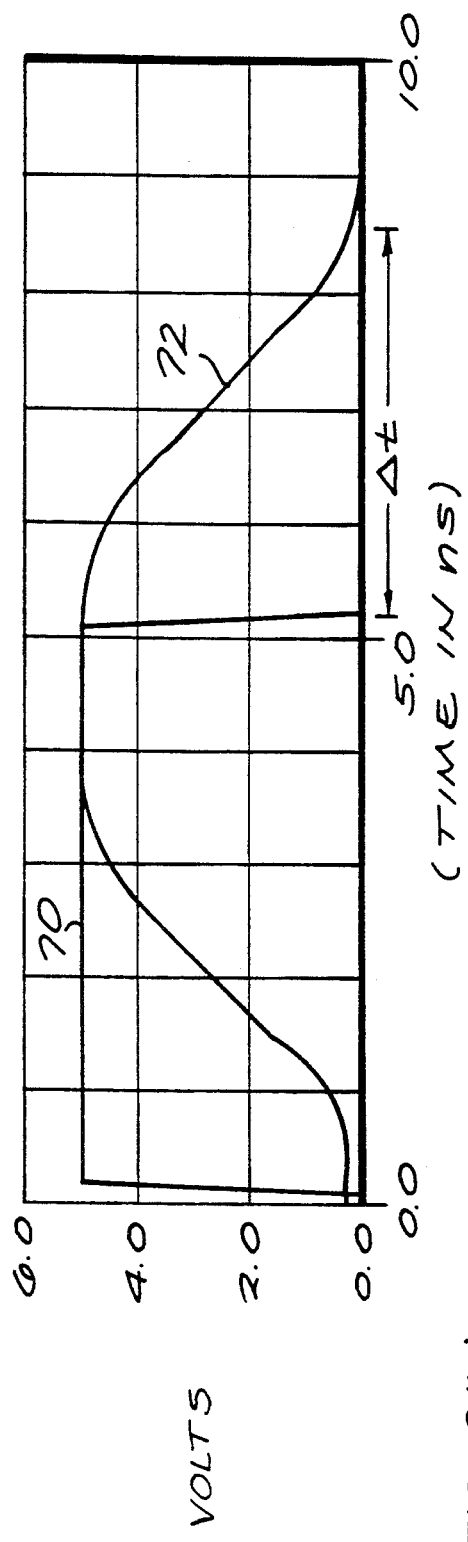
FIGS. 6(a) and 6(b) are graphs of the response of a buffer in accordance with the invention to an input pulse (load capacitance 50 pF)
Figure 6B:

FIGS. 6(a) and 6(b) are graphs of corresponding data that demonstrate the response of a buffer in accordance with the invention to an input pulse based upon a simulation with a pre-driver capacitance of 50 pF.

FIGS. 5(a) and 6(a) indicate the relationship between the input pulse $V_{IN}$ 70 and the response of the node 10 (curve 72). In both cases, it is observed that the input to the buffer is faithfully reproduced at the output node 10.

FIGS. 5(b) and 6(b) are graphs of the resultant base-emitter bias imposed upon the source-follower output transistor 12. As noted earlier, there exists a time differential $\Delta t$ during which the node 10 remains high after the base of the transistor 12 has been switched low. (Comparing FIGS. 5(a) and 6(a), it can be seen that this period, during which the source-follower transistor is subject to substantial reverse bias in prior art arrangements, is substantially increased by the incorporation of additional load capacitance) Referring to FIGS. 5(b) and 6(b), it can be seen that the base-emitter voltage never acquires any significant negative value during $\Delta t$.

The graphs of FIGS. 7(a) and 7(b) and FIGS. 8(a) and 8(b) present simulation-based data pertaining to the disabled state of the buffer (E low, $\overline{E}$ high). More particularly, the data of FIGS. 7(a) and 7(b) pertain to the response of the buffer to the driving of the node 10 by a high voltage from the external driver and that of FIGS. 8(a) and 8(b) pertain to the driving of the output node 10 with a low level voltage from the external driver.

Figure 9:
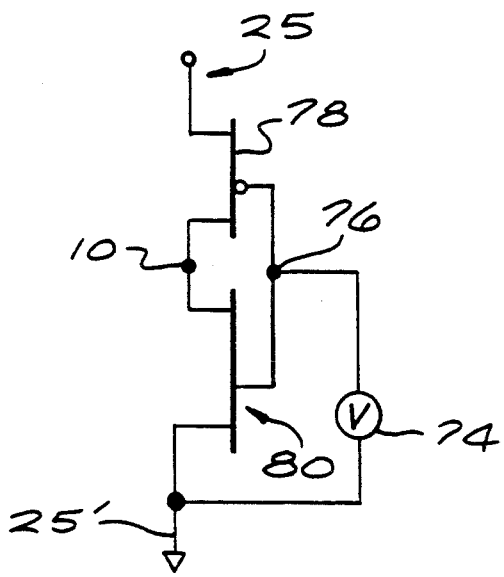
FIG. 9 is a circuit schematic diagram of an external driver for providing predetermined voltages at the output node of the buffer.

FIG. 9 is a schematic diagram of an external driver for deriving the data of the graphs FIGS. 7(a), 7(b), 8(a) and 8(b). A pulse generator 74 is arranged between ground and a node 76. The voltage provided at the node 76 is transmitted to the gates of a p-channel FET 78 and an n-channel FET 80. The FETs 78 and 80 conduct alternatively, pulling the node 10 either to the supply voltage 25 or to the ground voltage 25'.

The data of FIGS. 7(a), 7(b), 8(a) and 8(b) are presented for a capacitive loading of only 5 pF in combination with a large external driver as shown in FIG. 9. As such, very fast output transitions are provided that are well suited to test the robustness of the buffer with respect to reverse biasing and conduction of the bipolar transistors.

Figure 8A:
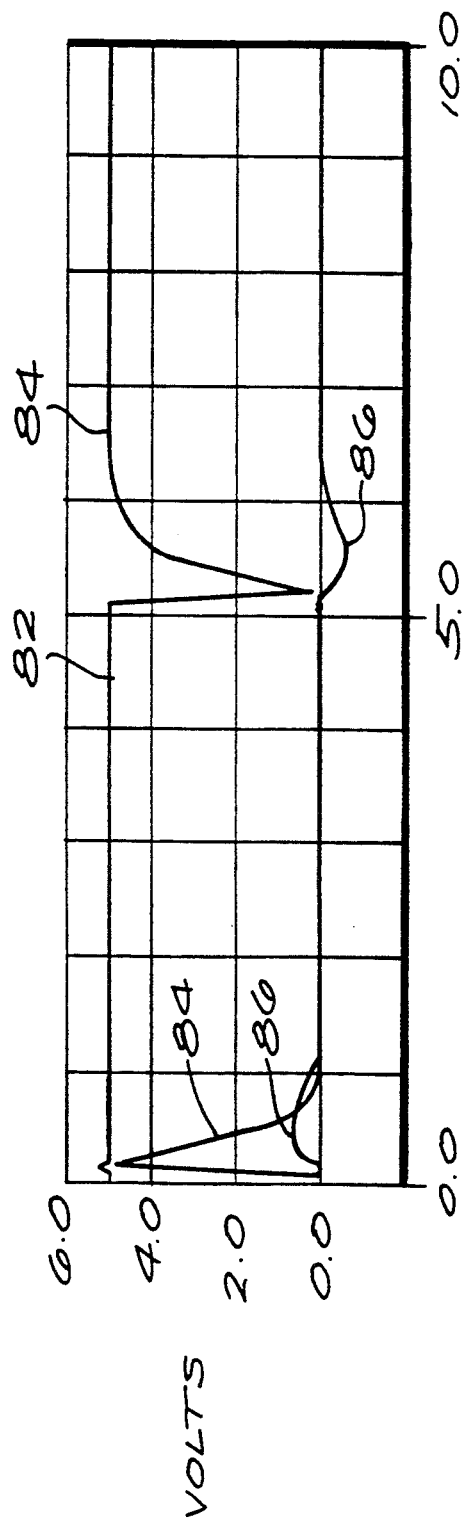
FIGS. 8(a) and 8(b) are graphs of the response of the invention in its disabled state to the imposition of a low voltage (from an external driver) to the buffer output node.

The voltage provided by the generator 74 to the node 76 is indicated in FIGS. 7(a) and 8(a) as pulse 82 and the response of the output node 10 is identified by the curve 84. The base-emitter bias of the output transistor is indicated by the curve 86. It is noted that the two above-referenced figures show identical results. In each case, the reverse bias of the transistor 12 is only a fraction of a volt over a very short time.

Figure 8B:
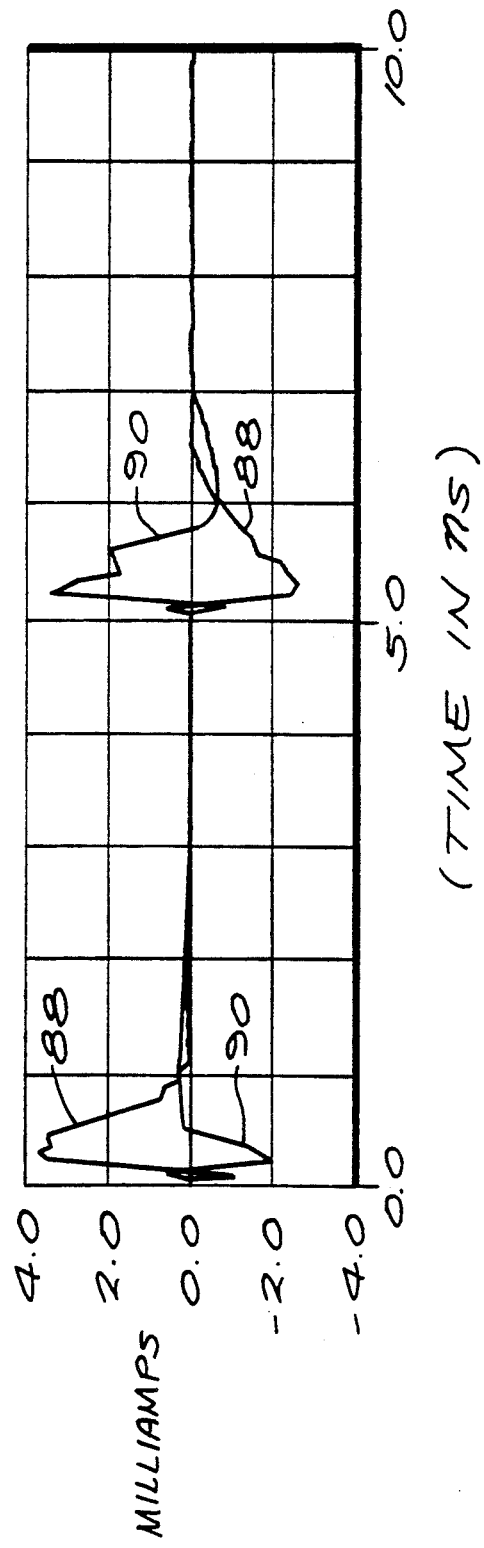

FIGS. 7(b) and 8(b) are graphs of the current flows 88 and 90 through the output transistors 12 and 14 respectively in response to the voltage applied to the output node 10 by the external driver. As noted, such current is in both cases quite small, corresponding to unavoidable capacitive coupling.

Thus, it is seen that the present invention provides an improved tri-state buffer of the type that includes a totem-pole arrangement of bipolar output transistors. By utilizing the teachings of this invention, one can avoid and eliminate the substantial and deleterious reverse biasing of the source-follower output transistor that has hampered the prior art.

While this invention has been described to respect to its presently preferred embodiment, it is not limited thereto. Rather, this invention is only limited insofar as defined by the following set of claims and includes within its scope all equivalents thereof.

What is claimed is:

1. A tri-state output buffer comprising:
   a first bipolar output transistor having a collector electrically coupled to a first power terminal, an emitter electrically coupled to an output node, and a base;
   a second bipolar output transistor having a collector electrically coupled to the output node, an emitter electrically coupled to a second power terminal, and a base;
   signal means, electrically coupled to the bases of the output transistors, responsive to an input signal to cause the output transistors to provide at the output node an output signal corresponding with the input signal;
   enable means, electrically coupled to the bases of the output transistors, responsive to an enable signal to override the signal means and cause the output node to assume a high impedance state when the enable signal assumes a "disable" value; and
   circuit means operative to prevent reverse bias between the base and the emitter of the first transistor whenever the output node is in the high impedance state, the circuit means comprising a variable-resistance current path between the base and the emitter, the circuit means operative to
   cause the current path to assume a low resistance and thereby prevent reverse bias when the enable signal assumes the "disable" value;
   cause the current path to assume a low resistance and thereby prevent reverse bias during a high-to-low transition in the value of the output signal when the output node is not in a high-impedance state; and
   maintain the current path at a low resistance and thereby prevent reverse bias if the input signal is maintained at a low level and the output node is not in a high-impedance state.

2. A tri-state output buffer as in claim 1 wherein the current path comprises a transmission gate.

3. In a tri-state output buffer for selectively providing a high signal level, a low signal level and a high impedance output to an output node, the buffer being of the type that includes an input port for receiving an input signal, an enable port for receiving an enable/disable signal, and first and second bipolar output transistors connected in series between first and second power terminals, the first transistor having a collector electrically coupled to the first power terminal, an emitter electrically coupled to the output node, and a base, the second transistor having a collector electrically coupled to the output node, an emitter electrically coupled to the second power terminal, and a base, an improvement comprising:
   a circuit for establishing an electrically-resistive path between the base of the first transistor and the emitter thereof, the circuit including means for selectively protecting the first transistor against harmful bias, the protecting means including:
   a transmission gate for adjusting the resistance of the path to a low resistance if a disable signal is present at the enable port or if the output node undergoes a high-to-low signal transition at a time when an enable signal is present at the enable port and to a high resistance if the output node undergoes a low-to-high signal transition at a time when an enable signal is present at the enable port;

an inverter stage; and a first and a second FET in parallel connection between said first power terminal and a first control node, the first FET having a gate connected to receive the input signal and the second FET having a gate connected to receive the enable signal, the control node being connected to one gate of said transmission gate, the output of said inverter state being connected to the other gate of said transmission gate whereby said control node controls said transmission gate.

4. An improvement as in claim 3 wherein the protecting means includes: a third and a fourth FET in parallel connection between said second power terminal and a second control node and a second transmission gate having inputs that receive the enable/disable signal, the second transmission gate operative to electrically couple the first and second nodes when the buffer is enabled and to decouple the nodes when the buffer is disabled.

5. A method for operating a tri-sate output buffer of the type that includes an input port for receiving an input signal and an enable port for receiving an enable/-disable signal and first and second bipolar transistors in series between first and second power terminals, the first transistor having a collector electrically coupled to the first power terminal, an emitter electrically coupled to an output node, and a base the second transistor having a collector electrically coupled to the output node and an emitter electrically coupled to the second power terminal, the method comprising:

electrically coupling the base and emitter of the first transistor to prevent any reverse bias if the enable/-disable signal assumes a "disable" value;

electrically decoupling the base and emitter of the first transistor if the enable/disable signal assumes an "enable" value;

electrically coupling the base and emitter of the first transistor to prevent any reverse bias during a high-to-low transition of the output signal if during said transition the enable/disable signal is at the "enable" value; and electrically coupling the base and emitter of the first transistor to prevent any reverse bias if the input signal is maintained at a low level and the enable/-disable signal is maintained at the "enable" value.

6. A tri-state output buffer comprising:

a first bipolar output transistor having a collector electrically coupled to a first power terminal, an emitter electrically coupled to an output node, and a base;

a second bipolar output transistor having a collector electrically coupled to the output node, an emitter electrically coupled to a second power terminal, and a base;

signal means, electrically coupled to the bases of the output transistors, responsive to an input signal to cause the output transistors to provide at the output node an output signal corresponding with the input signal;

enable means, electrically coupled to the bases of the output transistors, responsive to an enable signal to override the signal means and cause the output node to assume a high impedance state when the enable signal assumes a "disable" value; and circuit means operative to prevent reverse bias between the base and the emitter of the first transistor whenever the output node is in the high impedance state, the circuit means comprising:

a variable-resistance current path between the base and the emitter, the current path comprising a transmission gate; and an inverter stage and first and second transistors in parallel connection between the first power terminal and a first control node, the first transistor having a gate connected to receive the input signal and the second transistor having a gate connected to receive the enable signal, the control node being connected to one gate of the transmission gate and to an input of the inverter stage, the output of the inverter stage being connected to another gate of the transmission gate whereby the first and second transistors control the transmission gate;

the circuit means operative to cause the current path to assume a low resistance and thereby prevent reverse bias when the enable signal assumes the "disable" value.

7. A tri-state output buffer as in claim 6 wherein the circuit means comprises third and fourth transistors in parallel connection between the second power terminal and a second control node and a second transmission gate having inputs that receive the enable/disable signal, the second transmission gate operative to electrically couple the first and second nodes when the buffer is enabled and to decouple the nodes when the buffer is disabled.

8. A tri-state output buffer as in claim 6 wherein the circuit means is operative to:

cause the current path to assume a low resistance and thereby prevent reverse bias during a high-to-low transition in the value of the output signal when the output node is not in a high-impedance state.

9. A tri-state output buffer as in claim 8 wherein the circuit means comprises third and fourth transistors in parallel connection between the second power terminal and a second control node and a second transmission gate having inputs that receive the enable/disable signal, the second transmission gate operative to electrically couple the first and second nodes when the buffer is enabled and to decouple the nodes when the buffer is disabled.

* * * * *